United States Patent [19]

Sanders

[11] Patent Number: 4,562,137

[45] Date of Patent: * Dec. 31, 1985

[54] PHOTOSENSITIVE MATERIAL EMPLOYING ENCAPSULATED RADIATION SENSITIVE COMPOSITION

[75] Inventor: Frederick W. Sanders, Chillicothe, Ohio

[73] Assignee: The Mead Corporation, Dayton, Ohio

[ * ] Notice: The portion of the term of this patent subsequent to Aug. 16, 2000 has been disclaimed.

[21] Appl. No.: 454,396

[22] Filed: Dec. 30, 1982

[51] Int. Cl.⁴ .......................... G03C 1/40; G03C 1/00
[52] U.S. Cl. ..................................... 430/138; 430/211
[58] Field of Search ................ 430/138, 211, 345, 962

[56] References Cited

U.S. PATENT DOCUMENTS

| | | | |
|---|---|---|---|
| 2,953,454 | 9/1960 | Berman | 430/345 |
| 3,001,873 | 9/1961 | Foris | 430/138 |
| 3,072,481 | 1/1963 | Berman et al. | 430/138 |
| 3,090,687 | 5/1963 | Berman | 430/138 |
| 3,111,407 | 11/1963 | Lindquist et al. | 430/138 |
| 3,116,148 | 12/1963 | Miller | 430/138 |
| 3,202,510 | 8/1965 | Hollmann | 430/138 |
| 3,219,446 | 11/1965 | Berman | 430/138 |
| 3,272,629 | 9/1966 | Hills | 430/138 |
| 3,700,439 | 10/1972 | Phillips | 430/138 |
| 3,736,139 | 5/1973 | Yamashita et al. | 430/353 |
| 3,892,569 | 8/1975 | Speers | 430/541 |
| 4,149,887 | 4/1979 | Levy | 430/138 |
| 4,399,209 | 8/1983 | Sanders et al. | 430/138 |

FOREIGN PATENT DOCUMENTS

| | | |
|---|---|---|
| 44-17733 | 8/1969 | Japan . |
| 49-6212 | 2/1974 | Japan . |
| 52-34488 | 9/1977 | Japan . |
| 53-9519 | 1/1978 | Japan . |
| 53-9520 | 1/1978 | Japan . |
| 1001832 | 8/1965 | United Kingdom . |
| 1058798 | 2/1967 | United Kingdom . |
| 1141475 | 1/1969 | United Kingdom . |
| 1193923 | 6/1970 | United Kingdom . |

OTHER PUBLICATIONS

"What's Ahead?", Lloyd E. Varden, Modern Photography, p. 86, 1958.

Primary Examiner—John E. Kittle
Assistant Examiner—John L. Goodrow
Attorney, Agent, or Firm—Biebel, French & Nauman

[57] ABSTRACT

An imaging material employing an encapsulated radiation sensitive composition which undergoes a change in viscosity upon exposure having a sensitivity (log E) less than 4.0; images are formed by exposing the material to actinic radiation and rupturing the capsules whereby the internal phase is released from the capsules and participates in forming an image.

29 Claims, 4 Drawing Figures

PHOTOSENSITIVE MATERIAL EMPLOYING ENCAPSULATED RADIATION SENSITIVE COMPOSITION

BACKGROUND OF THE INVENTION

The present invention relates to a photosensitive material and to a process for imaging using the same. More particularly it relates to a photosensitive material in which a plurality of capsules, containing a radiation sensitive composition which undergoes a change in viscosity upon exposure, are distributed upon a support and images are formed by image-wise exposing the capsules to radiation and rupturing the capsules. Exposure renders the internal phase image-wise releasable from the capsules such that by rupturing the capsules and interacting the internal phase with developing agents, images can be formed.

While there are numerous examples of photosenstive materials in the art, none is particularly well adapted for copying documents or copying from microfilm, a reader-printer or a cathode ray tube. Two of the principal disadvantages of silver based imaging systems are their expense and the need for wet development processing. Attempts have been made to reduce the amount of silver used in previous systems and to develop dry development processings and one outgrowth of these efforts is the thermally developable silver imaging system. For a number of reasons, including a high level of fogging, the image quality of this latter system has not been as high as desired. At the same time socalled silverless systems that have been developed have not provided good sensitivity.

Some imaging systems based on photosensitive encapsulates are known.

Berman, U.S. Pat. No. 3,219,446 discloses a transfer imaging process in which azo-blue-"B" black dye is encapsulated with a photocrosslinkable polymer or a photopolymerizable monomer as a fluid droplet-containing film or a layer of fluid droplet-containing microcapsules. In this system, imaging is accomplished by image-wise exposing a layer of the encapsulate to electromagnetic radiation to cross-link the polymer or polymerize the monomer. This is stated to cause the liquid in the exposed capsules to assume a non-liquid, rigid condition. Images are formed by transferring the dye from the still liquid capsules to a receiving sheet by the use of pressure. Experimentation with the Berman system has shown that it has a very low sensitivity (i.e., requires a comparatively intense exposure to form an image) and provides poor image contrast.

Phillips, U.S. Pat. No. 3,700,439 discloses a photocopy process wherein Michler's ketone is encapsulated in a conventional manner and provided as a layer on a support. Michler's ketone itself is not a color former, but patterned irradiation of the ketone in the capsules converts the ketone to a colorless, acid colorable, dye precursor. When this dye precursor is subsequently contacted with an acid developer, such as acid clay, a visible image is obtained. Phillips discloses both a system in which the exposed imaging sheet is calendered face-to-face with an acid coated receiving sheet to form images and a system wherein the acid developer is on the same surface as the capsule coating so that after rupturing the capsules there is development without transfer.

Neither the Berman nor the Phillips imaging materials is the basis of any commercially available imaging material. In the case of the Berman system, the reason for this is probably the low sensitivity of the material and the poor image quality that is obtained.

Thus, there is a need for a dry-developable, silverless, photosensitive material which can be used for copying from reader-printers, cathode ray tubes and the like which provides good image quality and high sensitivity.

SUMMARY OF THE INVENTION

The present invention provides a photosensitive material comprising a support having a plurality of capsules distributed over the surface thereof wherein the capsules contain a radiation sensitive composition in the internal phase and the photosensitive material has a sensitivity less than 4.0.

The term "sensitivity" as used herein means the amount of radiation expressed in units of log ergs/cm$^2$ incident within an exposure time of less than 1 minute required to form an image having an image density difference ($\Delta D$) between exposed and unexposed areas of 0.10 density units upon processing as described herein. This value is measured at the wavelength at which the material possesses its maximum response to the incident radiation.

The sensitivity limit of 4.0 is the minimum (i.e., the numeric maximum) sensitivity of photosensitive materials within the scope of the present invention. In fact, much higher (numerically lower) sensitivities are attained in the present invention. Sensitivity can be measured by calibrating a monochromatic light source which emits radiation at the wavelength of the maximum sensitivity of the photographic material and measuring the exposure time required to form an image density of 0.1 density units difference with respect to an unexposed area. Image density is measured at the wavelength of maximum absorption of the image and can be measured with reasonable accuracy using a densitometer such as a Macbeth Densitometer using the filter setting which gives the maximum image density. Once the sensitivity of a certain photosensitive material has been determined, the sensitivities of other materials can be determined by comparison thereto by exposing both materials through a step wedge to a common source.

Due to the nature of imaging in accordance with the present invention there will be some variation in image density and hence sensitivity (e.g., $\pm 0.15$ units of Log E) with development conditions such as humidity, temperature, nature of the color former and developer, nip pressure, etc. Typically, however, the photosensitive materials of the present invention have sensitivities on the order of 3 or less and, as such, these variations are small. The preferred photosensitive materials provide a sensitivity of approximately 3 to 2 or less.

Images are formed by image-wise exposing the capsules to actinic radiation and rupturing the capsules. Exposure produces a change in the viscosity of the radiation sensitive composition within the capsules and controls which capsules rupture and release the internal phase. The internal phase is image-wise released from the ruptured capsules and participates in subsequent interactions which result in the image. For example, the released internal phase may carry, activate, or mobilize an image-forming agent which directly produces an image or produces an image upon interaction with a developer material. Alternatively, the internal phase itself may function as an image forming agent and interact with a developer to produce an image as in the case where the internal phase released is used to selectively attract a toner material. This in turn determines whether an image forming agent internally or externally associated with the capsules is able to interact with a developer or otherwise proceed with imaging as discussed in more detail below.

The term image-forming agent refers to those agents, the image-forming availability of which is controlled by the release of the internal phase and includes dyes, color precursors, solvents, developers, oils, and the like.

The photosensitive materials of the invention may be positive working or negative working depending upon the nature of the radiation sensitive composition. Where the radiation sensitive composition contains a photopolymerizable or photocrosslinkable material, the internal phase solidifies or increases in viscosity in the exposed areas and remains liquid in the unexposed areas. In this manner the release of the internal phase is controlled and positive images are formed. On the other hand, where the capsules contain a photodepolymerizable material exposure reduces the viscosity of the internal phase and the elements active in the image-forming process are released in the exposed areas and negative images are formed.

Radiation sensitive materials previously used in the area of photoresists are useful in the present invention such as photopolymers, photopolymerizable monomers, oligomers, and the like and photodepolymerizable polymers and the like, however, it has been found that photosensitive material of the present invention is significantly more sensitive to light than prior photoresist systems. The photographic response is significantly enhanced by encapsulating these radiation sensitive materials compared to when using them in a thin film. In some cases the sensitivity of the materials of the invention is ten times greater than that of the analogous photoresist. One possible explanation for the enhanced sensitivity is that a much lower degree of polymerization, crosslinking or depolymerization is required to achieve image formation. In a photoresist complete insolubilization is required to fix the polymer in the image areas. In the encapsulated system of the present invention, on the other hand, only a partial reaction of the radiation sensitive composition (e.g., 15%) appears to be required to control imaging. This makes it possible to image the inventive material with practical, convenient exposure sources such as a fluorescent tube, a cathode ray tube, etc.

Without limiting the invention to any particular operational theories, imaging appears to occur by one or a combination of two mechanisms. Under the first mechanism (Mechanism 1), images are formed by differential capsule rupture which is a function of the hardness (viscosity) of the internal phase). More capsules rupture in some areas than others depending on the degree of exposure. In areas of very intense exposure or no exposure all or none of the capsules rupture depending on whether the radiation sensitive material is positive or negative working. In "gray" areas of intermediate exposure the number of capsules that rupture is roughly proportional to the degree of exposure.

Under the second theory (Mechanism 2), all the capsules or a number in excess of a number dictated by the degree of exposure may rupture, but the amount of active material released by the internal phase is a function of the viscosity of the internal phase as determined by the degree of exposure. For example, where the capsules contain a color precursor, the amount of precursor which is capable of reacting with the color developer and forming an image following exposure and capsule rupture is controlled by the viscosity of the internal phase which is a function of the degree of exposure. For example, in positive working systems, capsules may rupture but due to the high viscosity of the internal phase produced by exposure they do not release the color precursor or they release only a portion of the precursor in accordance with the degree of exposure.

Under both of the above theories, the internal phase is image-wise released from the capsules.

One imaging process of the present invention comprises image-wise exposing the photosensitive material to actinic radiation, rupturing the capsules such that the internal phase is image-wise released, and reacting the internal phase released from the ruptured capsules (or an image-forming agent associated therewith) with a developing agent to form an image. The capsules are not necessarily ruptured in accordance with the degree of exposure since, in accordance with Mechanism 2, capsules may rupture but not release the internal phase.

In another embodiment of the present invention a visible dye is contained in the internal phase with the radiation sensitive composition. Imaging is performed as described above except that it is not necessary to react the internal phase with a developing agent to detect the image. In this embodiment, the dye is differentially transferred to an image receiving sheet which can be plain paper. In another version of this practice, the dye is outside the capsules and the internal phase image-wise released from the capsules dissolves the dye as a function of the exposure and carries it to the imaging sheet.

The photosensitive materials and imaging processes of the present invention can be used to form a variety of different type images depending upon the nature of the image-forming agents used in conjunction with the capsules. For example, related and commonly assigned U.S. applications Ser. Nos. 320,643 and 320,356 filed Nov. 12, 1981 are incorporated herein by reference. These applications disclose systems applicable herein for forming images by reacting chromogenic materials such as color precursors and color developers used in the carbonless paper art, wherein the reaction of these materials is exposure controlled as described above by associating their activation, mobilization or release with the release of the internal phase. In related and commonly assigned U.S. application Ser. No. 339,917 filed Jan. 18, 1982, also incorporated by reference a system for forming multicolor images is disclosed.

In addition to the foregoing embodiments, the present invention can also be used to form images by various other physical and/or chemical reactions such as by adjusting the affinity of the internal phase for a toner such that after image-wise rupturing the capsules the toner selectively adheres to the support in the areas of ruptured capsules. In still another embodiment, images can be formed by including a chelating agent in the internal phase which reacts with a metal salt to generate a color image. In another version of this embodiment the chelating agent may be outside the capsules and dissolved by the released internal phase and carried to a salt developer layer.

The present invention will be described in more detail by reference to the following drawings:

DETAILED DESCRIPTION OF SPECIFIC EMBODIMENTS

The term "actinic radiation" is used herein to include the entire spectrum of electromagnetic radiation including ultraviolet and infrared radiation, the visible spectrum, as well as X-ray and ion beam radiation and any radiation useful to image-wise change the viscosity of the internal phase consistent with the present invention. The preferred forms of radiation are ultraviolet radiation and visible light having a wavelength of 190 to 800 nm and more preferably 380 to 480 nm.

Figure 1:
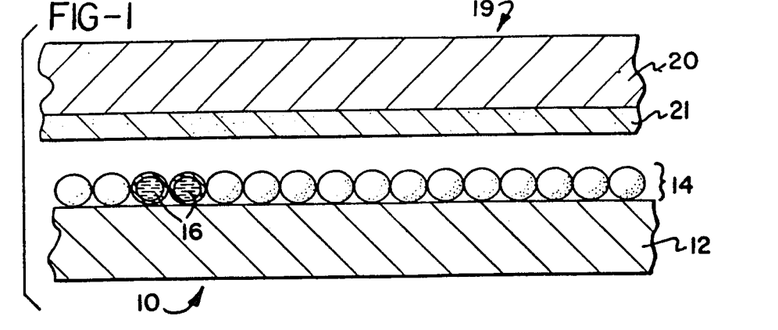
FIG. 1 is a schematic of one example of a photosensitive material of the present invention in its most basic form.

FIG. 1 illustrates one example of the photosensitive material of the present invention. Therein an imaging sheet 10 is shown comprising a support 12 coated with a layer of microcapsules 14. The microcapsules are filled with an internal phase 16 containing a radiation sensitive composition. In actuality, the microcapsules 14 are not visible to the unaided eye. The image forming agent associated with the capsules may be present within phase 16 or associated with the capsules externally such as in the form of a separate layer containing a dye, color presursor or developer.

Figure 2:
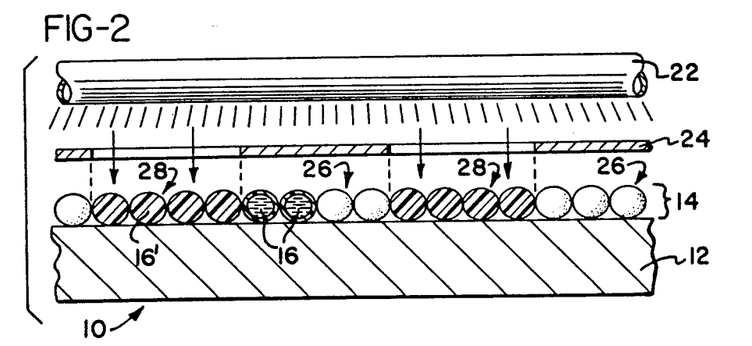
FIG. 2 illustrates one example of exposing the photosensitive material of the present invention.

The imaging sheet 10 can be exposed by transmission imaging as shown in FIG. 2 wherein a source of radiant energy 22 is positioned above the surface of the imaging sheet 10 with a mask 24 therebetween. Transmission imaging is useful in copying microfilm on a reader printer or in copying from a cathode ray tube. The imaging sheet of the present invention is also useful in reflected light imaging to copy printed documents.

Figure 3:
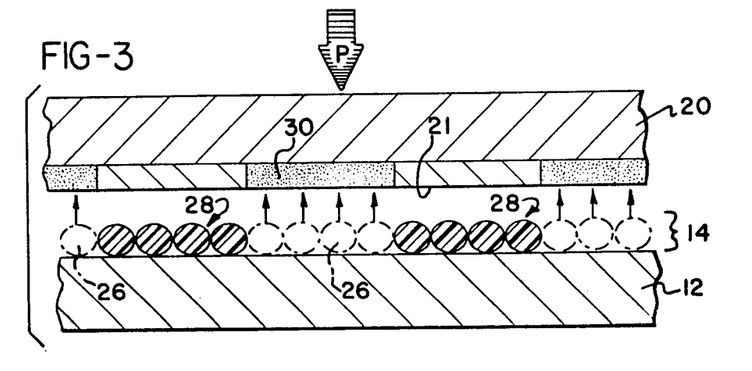
FIG. 3 illustrates developing the photosensitive material of the present invention using a transfer sheet coated with a developer material.

The photosensitive material illustrated in the Figures is a positive working material in which the capsules contain a radiation curable composition. Irradiation of the exposed areas 28 causes the radiation curable material in the internal phase 16 to polymerize, thereby gelling, solidifying or otherwise increasing its viscosity. To simplify the illustration, internal phase 16' in the exposed areas 28 is shown as being solidified whereas the internal phase 16 in the unexposed areas 26 remains liquid. In fact, as pointed out above, it is not necessary to completely polymerize the internal phase to prevent the capsules from rupturing or releasing the image-forming agent. In this manner, the internal phase or the image-forming agent optionally associated with the capsules is prevented from interacting with a developer material in the exposed areas.

Image formation or development is shown in FIG. 3 wherein the now exposed imaging sheet 10 is used as a transfer sheet and is placed with its microcapsule layer 14 in face to face contact with the developer material 21 on sheet 19 and pressure is uniformly applied across the sheets. The microcapsules are shown as being ruptured in the unexposed areas 26 and not rupturing the capsules in the exposed areas 28, however, under Mechanism 2 described above, or in the gray areas under Mechanism 1, some of the capsules in the exposed areas might rupture, but release of the internal phase occurs in inverse proportion to the increased viscosity which results in the internal phase 16'.

Typically, the capsules are ruptured by passing the imaging sheet 10 and the developer sheet 20 together through a pressure nip. This causes the internal phase 16 from the unexposed areas 26 to transfer to the developer sheet 19, as shown schematically by arrows in FIG. 3. Other means than pressure may be used to rupture the capsules including ultrasonic vibration, solvent vapor and other means. Upon transfer of the internal phase 16 to the developer sheet 19, image-forming agents in or activated by the internal phase react with the developer layer 21 and form an image 30 on the developer sheet. Transfer is not necessary in those embodiments in which self contained imaging sheets are used wherein the developer material 21 is carried on the imaging sheet 10 with the capsules as disclosed in U.S. application Ser. No. 320,643 incorporated herein.

In accordance with the invention, the internal phase comprises a radiation sensitive composition which undergoes a change in viscosity upon exposure to actinic radiation. Typically, these compositions include a photoinitiator and a monomer, dimer, or oligomer which is polymerized to a higher molecular weight compound; or a polymer which is crosslinked upon exposure. Alternatively they may contain a compound which is depolymerized or otherwise decomposed upon exposure.

A number of radiation curable materials are suitable for use in this process. Ethylenically unsaturated organic compounds are particularly useful. These compounds contain at least one terminal ethylene group per molecule. Typically, they are liquid and can double as a diluent oil for the internal phase. Ethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from the Richardson Company, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

An example of radiation depolymerizable materials useful in other embodiments of the invention are 3-oximino-2-butanone methacrylate which undergoes main chain scission upon U.V. exposure and poly 4'-alkyl acylophenones. See Reichmanis, E.; Am. Chem. Soc. Div. Org. Coat. Plast. Chem. Prepr. 1980. 43, 243–251 and Lukac, I.; Chmela S., Int. Conf. on Modif. Polym. 5th. Bratislave, Czech. July 3–6, 1979, I.U.P.A.C. Oxford, England 1979, 1, 176–182.

The radiation sensitive composition must make up a large enough proportion of the internal phase to effectively control its release or the flow of the image-forming agent upon exposure. This generally means that the radiation sensitive material must constitute approximately 40 to 99% by weight of the internal phase of the capsules.

The internal phase may additionally include a diluent oil. Inclusion of the oil will often improve half tone gradation in visual images. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

The photoinitiator absorbs the exposure radiation and generates a free radical alone or in conjunction with a sensitizer. Various known photoinitiators are useful including homolytic photoinitiators which are converted to an active species by radiation and generate a radical by abstracting a hydrogen from a hydrogen donor and photoinitiators which complex with the sensitizer to produce a free radical generating species and photoinitiators which otherwise generate radicals in the presence of a sensitizer. If the system relies upon ionic polymerization, the photoinitiator may be the anion or cation generating type depending on the nature of the polymerization.

Examples of photoinitiators useful in the present invention include diaryl ketone derivatives, benzoin alkyl ethers. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of photoinitiators. For ultraviolet sensitivity a preferred initiator is a combination of Michler's ketone and benzoin methyl ether (preferred ratio 2:5) or benzophenone. Another useful combination is 2,2'-dimethoxy-2-phenylacetophenone, isopropylxanthone and ethyl paradimethylaminobenzoate. The latter combination is preferably used with TMPTA to provide a radiation sensitive composition.

The amount of photoinitiator in the internal phase, when one is used, depends on the particular photosensitive material chosen. It must be present in an amount sufficient to initiate polymerization or cross-linking within a short exposure time. For example, if benzoin methyl ether is the photoinitiator, it is typically present in an amount equal to approximately 10% of the weight of photosensitive material in the capsules' internal phase. Those skilled in the art can readily determine the amount suitable for the desired exposure properties when other substances are used.

A radiation sensitive composition as described above can be encapsulated in various wall formers using techniques known in the area of carbonless paper including coacervation, interfacial polymerization, polymerization of one or more monomers in an oil, as well as various melting, dispersing and cooling methods. To achieve sensitivities less than 4.0 it is important that an encapsulation technique be used which provides high quality capsules which are responsive to changes in the internal phase viscosity in terms of their ability to rupture.

Oil soluble materials have been encapsulated in hydrophilic wall-forming materials such as gelatin-type materials (see U.S. Pat. Nos. 2,730,456 and 2,800,457 to Green et al) including gum arabic, polyvinyl alcohol, carboxy-methylcellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urearesorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle).

The material used to form the capsule walls must be selected based on the radiation sensitive composition that is to be encapsulated. The capsule forming material should also be substantially transparent to the radiation to which it will be exposed. For the systems described above, urea-resorcinol-formaldehyde capsules are preferred.

A capsule size should be selected which minimizes light attenuation. The mean diameter of the capsules used in this invention typically ranges from approximately 1 to 25 microns. As a general rule, image resolution improves as the capsule size decreases. If the capsules become too small, they may disappear in the pores or the fiber of the substrate. These very small capsules may therefore be screened from exposure by the substrate. They may also fail to rupture when exposed to pressure or other rupturing means. In view of these problems, it has been determined that a preferred mean capsule diameter range is from approximately 3 to 15 microns, and particularly 3 to 10 microns. Technically, however, the capsules can range in size up to the point where they become visible to the human eye.

An open phase system may also be used in accordance with the invention instead of an encapsulated one. This can be done by dispersing what would otherwise be the capsule contents throughout the coating on the substrate as discrete droplets. Suitable coatings for this embodiment include polymer binders whose viscosity has been adjusted to match the dispersion required in the coating. Suitable binders are gelatin, polyvinyl alcohol, polyacrylamide, and acrylic lattices. Whenever reference is made to "capsules" and "encapsulation" without reference to a discrete capsule wall in this specification or the appended claims, those terms are intended to include the alternative of an open phase system.

The most common substrate for this invention is paper. The paper may be a commercial impact raw stock, or special grade paper such as cast-coated paper or chrome-rolled paper. The latter two papers are preferred when using capsules having a diameter between approximately 1 and 5 microns, because the surface of these papers is smoother and therefore the capsules are not as easily embedded in the stock fibers. Transparent substrates such as polyethylene terephthalate and translucent substrates can also be used in this invention. Their advantage is that the latent image formed need not be reversed for printing.

The photosensitive material of the present invention can be used to control the interaction of various image-forming agents.

In one embodiment of the present invention the capsules contain a benign visible dye in the internal phase and images are formed by contacting the exposed imaging material under pressure with a plain paper or a paper treated to enhance its affinity for the visible dye. A benign dye is a colored dye which does not interfere with the imaging photochemistry, for example, by relaxing the excited state of the initiator or detrimentally absorbing or attenuating the exposure radiation. Sudan Blue and Rhodamine Blue are just a few examples.

In another embodiment of the invention, images are formed through the reaction of a pair of chromogenic materials such as a color precursor and a color developer either of which may be encapsulated with the radiation sensitive composition and function as the image forming agent. These embodiments are disclosed in U.S. applications Ser. Nos. 320,356 and 320,643 and are incorporated herein by reference. In general, these materials include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used alone or in combination.

The developer materials conventionally employed in carbonless paper technology are also useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

As indicated previously, the developer may be present on the photosensitive sheet or on a separate imaging sheet. In addition the color former and color developer may be separately encapsulated in photosensitive capsules and upon exposure both capsule sets image-wise rupture releasing former and developer which mix to form the image. Alternatively, the developer can be encapsulated in non-photosensitive capsules such that upon processing all developer capsules rupture and release developer but the color former containing capsules rupture in only the exposed or unexposed area which are the only areas where the color former and developer mix. Still another alternative is to encapsulate the developer in photosensitive capsules and the color former in non-photosensitive capsules. In a further modification the developer may be encapsulated with the photosensitive material and the color former can be provided in a separate layer on the same support or on a separate support. It will also be apparent that the foregoing embodiments are not limited to the combination of color precursor and color developer but also apply to other combinations of image forming agents and developer materials.

Images can also be formed in other ways. In fact, it is not necessary to include any image-forming agent per se in the internal phase. An aqueous dispersion of photosensitive capsules and color former may be coated on a suitable substrate (e.g., paper) and after exposure, the sheet may be processed through a nip roller in contact with a receiver sheeting containing developer. Unexposed capsules on the imaging sheet rupture and release unpolymerized monomer which serves as a transport medium to transfer dye precursor to the receiver sheet, where the image is formed. In another format, dry powdered dye precursor may be incorporated into a receiver sheet by dispersing the precursor in an aqueous slurry of dye developer and coating the dispersion on the receiver sheet. The imaging sheet, without color former or developer, may be exposed and subsequently processed through a nip-roller in contact with the receiver sheet. In a photopolymerizable system, for example, unexposed capsules rupture and the unpolymerized monomer transfers to the receiver sheet where it serves as a reaction medium for the color former and developer, thus forming an image.

Still another format is a form of self-contained sheet. A base sheet may be consecutively coated with the following formulations: (a) powdered color former suspended in an aqueous binder solution such as poly(-vinyl alcohol) solution; (b) a color developer composition such as acid clay mixed with titanium dioxide (a U.V. reflector); and (c) an aqueous suspension of photosensitive capsules. Following exposure, the sheet may be processed through a nip roller. In the case of a photopolymerizable system, unexposed capsules rupture, releasing the unpolymerized monomer. The monomer migrates through the developer/titanium dioxide layer to the color former laver where it serves as a transport medium to bring the color former to the developer layer, causing image formation.

In the case where images are developed using a toner, the affinity of the liquid internal phase for the toner results in the toner adhering to the photosensitive materials in the areas in which the capsules are ruptured and the internal phase is image-wise released. The toner does not adhere to the unruptured capsules and in this manner images are formed. For example, a photosensitive sheet, containing capsules with no precursor or dye, is exposed and processed through a nip roller. In a positive working material, unexposed capsules rupture releasing unpolymerized monomer in the unexposed areas. These areas, as a result, possess a surface tackiness that can be used to capture carbon black dust, thus producing an image.

As illustrated above, the present invention is not necessarily limited to embodiments where the image-forming agent is present in the internal phase. Rather, this agent may be present in the capsule wall of a discrete capsule or in the binder of an open phase system or in a binder or coating used in combination with discrete capsules or an open phase system designed such that the image-wise ruptured capsules release a solvent for the image-forming agent. Embodiments are also envisioned in which a dye or chromogenic material is fixed in a capsule wall or binder and is released by interaction with the internal phase upon rupturing the capsules.

Another means of forming images is by the interaction of a salt and chelating agent. For example, N,N'-bis(2-octanoyloxyethyl) dithiooxamide can be encapsulated in photosensitive capsules to produce an imaging sheet. Following exposure, the sheet is processed through a nip roller in contact with a receiver sheet coated with nickel nitrate. In a positive working material, unexposed capsules rupture resulting in transfer of dithiooxamide to the receiver sheet. Chemical reaction between copper nitrate and dithiooxamide produces a readily visible image. Some typical examples of other useful image-forming pairs of this type are illustrated below.

The present invention is further illustrated by the following non-limiting examples. The sensitivity values reported therein were determined by exposing the example material and a material of known sensitivity to a common source through a step wedge. The sensitivity of the sample of known sensitivity was previously determined by the procedure outlined in Example 7 below.

CAPSULE AND IMAGING SHEET PREPARATION

The capsules used in the following examples were prepared by the standard procedure set forth hereinbelow unless indicated otherwise.

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g urea and 0.8 g resorcinol were added and the solution was maintained at 60° C. to prepare a continuous phase. The continuous phase was placed in a Waring blender and a specified amount of photoactive internal phase at 60° C. was added with blending at 90 V for 90 seconds. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

Imaging sheets were prepared by coating capsule batches prepared as above on a paper substrate such as 80 pound Black and White Enamel stock (a product of Mead Corporation), impact raw stock or the like using a No. 12 meyer rod after diluting 1:1 with water containing 1% Triton-X 100 (Rhom and Haas Chemical Co.). The resultant coat weights ranged from about 3 to 6 g/m$^2$.

EXAMPLE 1

An imaging sheet was prepared as described above using a solution of 50 g trimethylolpropane triacrylate (TMPTA), 6 g of a 50% solution of Copikem X (a color precursor available from Hilton-Davis) in dibutyl succinate, 2.2 g benzophenone and 0.28 g Michler's ketone as the photoactive internal phase. The imaging sheet so prepared was exposed through a step wedge to a near ultraviolet light source and passed through a pressure nip in face-to-face (active layer to active layer) contact with an acid clay (Silton F-150) developer sheet prepared as follows:

To 218 parts water were added with slow stirring 5.8 parts 50% aqueous suspension of styrene-butadiene latex, 40 parts 10% aqueous 1.5% ethylated starch, 17 parts hydrated silica gel, 21 parts zinc carbonate, 13 parts 47% aqueous sodium silicate, 1 part sodium hexametaphosphate and 120 parts Silton F-150 clay. After stirring at ambient temperature for 1 hour, the mixture was stabilized by the addition of 0.1 part 37% aqueous formaldehyde and coated upon 80 lb. Black and White Enamel paper stock using a #10 drawdown bar as the coating device. The sheets were completed by brief drying in a recirculated hot air (95° C.) oven.

Good quality images were obtained. The sensitivity (log E) of the imaging sheet was determined to be 3 at 380 nm.

EXAMPLE 2

An imaging sheet (A) was prepared as described above using the internal phase made up of a photosensitive composition containing a visible dye:

| 50 g | TMPTA |
|---|---|
| 12 g | 2,2'dimethoxy-2-phenylacetophenone (Irgacure 651 Ciba Giegy) |
| 1 g | isopropyl thioxathone (Quantacure ITX, Blenkinsop & Ltd.) |
| 1 g | ethyl paradimethylaminobenzoate (Quantacure EPD, Blenkinsop & Co. Ltd.) |
| 1 g | Rhodamine B |

A second imaging sheet (B) was prepared using, as the internal phase, the visible dye composition:

| 50 g | TMPTA |
|---|---|
| 12 g | Irgacure 651 |
| 1 g | Quantacure ITX |
| 1 g | Quantacure EPD |
| 1 g | Sudan Blue |

A third sheet (C) was prepared as above using as the internal phase:

| 50 g | TMPTA |
|---|---|
| 12 g | Irgacure 651 |
| 1 g | Quantacure ITX |
| 1 g | Quantacure EPD |
| 3 g | Nigrosine Base Dye |

Each of sheets A, B and C was prepared by coating the capsule preparation on 80 pound Black and White Enamel stock using a No. 12 drawdown rod on a loop coater. Each sheet was exposed through a step wedge in a sensitometer equipped with one 15T8/BL and one 15T8/D fluorescent tube. The sample was nominally 10 to 12.5 cm from the tube surface. Following exposure, the sheet was passed through the nip between two pressure rollers in contact with a second sheet of 80 pound Enamel stock.

The imaging sheets provided the photographic properties shown in Table I below.

TABLE I

| Imaging Sheet | A | B | C |
|---|---|---|---|
| Exposure Time | 4 sec. | 16 sec. | 1 hour |

TABLE I-continued

| Imaging Sheet | A | B | C |
|---|---|---|---|
| Dmin. | .084 | .051 | — |
| Dmax | .236 | .358 | — |
| Gamma | −.129 | −.427 | — |
| Dynamic Range | 3.0 f/stops | 2.0 s/stops | — |
| Average Particle Size (μ) | 3.5 | 7.8 | 3.2 |
| Log E at 380 nm | 3 | 3 | — |

No image could be obtained using Sheet C as described above because the Nigrosine dye interferes with the imaging photochemistry. Good images were obtained with Sheets A and B which used benign dyes which did not interfere with the imaging.

EXAMPLE 3

A cpasule batch was prepared as described above containing as the internal phase a solution of 40 g TMPTA, 10 g methyl methacrylate, 0.5 g benzoin methyl ether, and 0.28 Michler's ketone as the internal phase. Imaging sheets were prepared as above and exposed for 4 seconds in the sensitometer referred to in Example 2 through a step wedge. Following exposure the sheet was coated with a saturated solution of copikem IV color precursor (Hilton-Davis) in methyl methacrylate containing a small amount of crystal violet lactone. The samples were dried at room temperature and developed as above using the Silton-F-150 clay developer sheet described in Example 1 to obtain a black image. The sensitivity (log E) of the imaging sheet was about 3 at 380 nm.

EXAMPLE 4

Copikem IV color precursor (Hilton-Davis) was dispersed as a dry powder in a Silton-F-150 clay developer coating composition described in Example 1 and coated on paper to form a developer sheet. Capsules containing 50 g TMPTA, 0.5 g benzoin methyl ether, 0.3 g Michler's ketone and 3 g Copikem XX as the internal phase were prepared and coated on a paper substrate to form an imaging sheet as in the standard procedure outlined above. The imaging sheet was exposed as in Example 4 and developed by passing it through nip rollers in contact with the developer sheet. The characteristic pink of Copikem XX was observed image-wise on the developer sheet, however, the color was clearly toned by the Copikem IV black originating in the developer sheet. On heating the sample in a 90° C. oven for 5 minutes, the density of the Copikem IV developed further. The sensitivity )log E) of the sheet was 3 as measured at 380 nm.

EXAMPLE 5

A self-contained imaging sheet having a first layer of a color precursor, a second layer of a dye developer and a third layer of photocapsules was prepared as follows:

A first coating composition (A) was prepared by mixing 10 g acetone with 0.5 g Copikem (IV) color precursor. The solution was stirred until clear and then added to 100 ml of water containing 10 drops of Aerosol OT-75 surfactant (American Cyanamid Co.). The resulting suspension of the dye precursor was examined under the microscope and particles of 2 to 3 microns were observed. The dye suspension was diluted 1:1 with an 8% poly(vinyl alcohol)/water solution for coating. The coating mix was 4% poly(vinyl alcohol) and 0.25% Copikem IV based on weight water and 6% Copikem IV and 94% poly(vinyl alcohol) based on total solids.

A second coating composition (B) was prepared by mixing 2.0 g $TiO_2$ with Transrite color developer composition available from Mead Paper Company.

A third coating composition (C) containing 10 g capsules prepared as above wherein the internal phase was a solution of 40 g TMPTA, 10 g methyl methacrylate, 0.5 g benzoin methyl ether and 0.28 g Michler's ketone, and adding 10 ml water and one drop Aerosol OT-75 surfactant.

The imaging sheet was prepared by sequentially drawing down each compositin in the order A, B, then C with a No. 10 hand drawdown on 80 pound Black and White Enamel stock. The sheet was exposed in a sensitometer equipped with two 15T8/BLB tubes for 4 seconds at a distance of about 12.5 cm through a step wedge. A step wedge image was obtained upon passing this self-contained sheet through a pressure nip and gently heating for 1 minute. The sheet provided sensitivity of 3 at 380 nm.

EXAMPLE 6

Capsules not containing a dye or color presursor were prepared as in Example 3 and coated on a paper substrate. The imaging sheet was exposed for 8 seconds as in Example 3 through a step wedge. The exposed sheet was placed coating side down in contact with an 80 pound Black and White Enamel stock transfer sheet and run through hand operated nip rollers. The transfer sheet was then placed in a beaker containing carbon black and shaken. The internal phase from the ruptured capsules picked up carbon black and visible images were obtained.

EXAMPLE 7

An imaging sheet was prepared as above using a solution of 50 g TMPTA, 12 g of Irgacure 651, 1 g Quantacure ITX, 1 g Quantacure EPD and 6 g of 50% Copikem X in dibutyl succinate as the internal phase. Samples of the imaging sheet were exposed with a monochrometer (350nm with a 10nm band width) having a light flux of 675 ergs/$cm^2$/sec as determined by ferrioxalate actinometry using exposure times ranging from 0 to 16 seconds. The samples were developed by passing them in face-to-face contact with a developer sheet through a pair of nip rollers. The developer sheet was prepared as follows: A mixture of 852 g water, 240 g 25% Tamol 731 (Rohm & Haas Chemical Co.), 75 g HT clay, 1000 g KC-11 (a synthetic developer manufactured by Fuji Foto Film Company, Ltd.), 15 g Calgon T (Calgon, Inc.), 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids to give a coat weight of 8 to 10 g/$m^2$.

Figure 4:
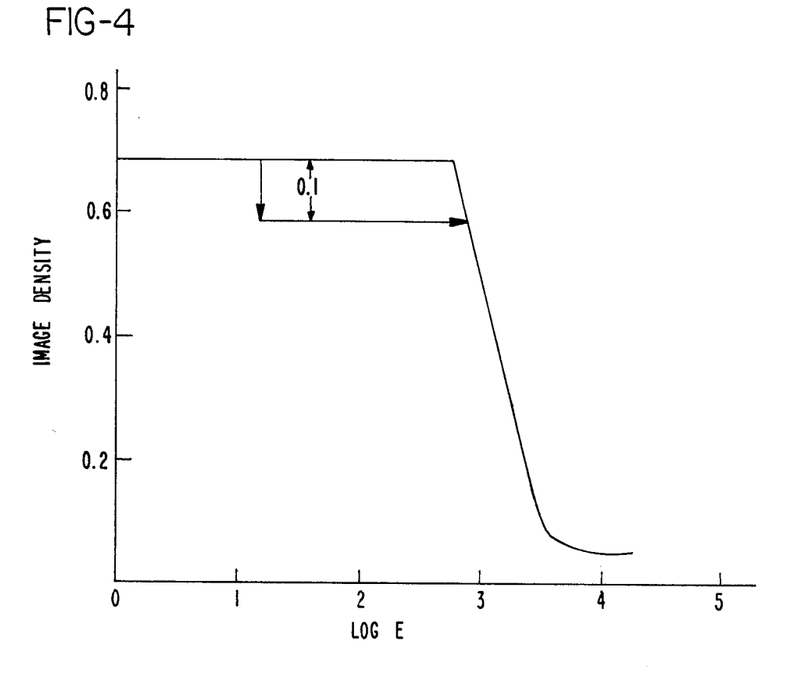
FIG. 4 is the H & D curve for the imaging material of Example 7.

The image density was measured with a Macbeth Densitometer with the red filter setting. The photographic data is shown in the Table below. The H & D curve is shown in FIG. 4. The sensitivity of the imaging sheet was determined to be 2.9–3.1.

| Exposure Time (sec) | E (ergs) | Log E | D (units) |
|---|---|---|---|
| 0 | 0 | less than 2.81 | 0.66 |

-continued

| Exposure Time (sec) | E (ergs) | Log E | D (units) |
|---|---|---|---|
| 1.0 | 675 | 2.83 | 0.66 |
| 2.0 | 1350 | 3.13 | 0.42 |
| 3.0 | 2025 | 3.31 | 0.27 |
| 4.0 | 2700 | 3.43 | 0.15 |
| 8.0 | 5400 | 3.73 | 0.06 |
| 16.0 | 10800 | 4.03 | 0.06 |

EXAMPLE 8

Capsules were prepared in accordance with the standard procedure described above using as the internal phase a solution of 50 g TMPTA, 5.0 g N,N'-bis(2-octanoyloxethyl)dithiooxamide, 12 g, Irgacure 651, 1 g Quanticure ITX, and 1 g Quanticure EPD. Imaging sheets were prepared by drawing down a composition containing 1 part capsules and 1 part Triton-X100 in water 10% aqueous solution on 80 pound Black and White Enamel stock with a No. 10 meyer bar and oven drying.

A developer sheet was prepared by coating a solution of 86 g nickel nitrate in 500 ml water with a No. 10 meter bar on 80 pound Black and What Enamel stock.

The imaging sheet was exposed with a near ultraviolet light source through a step wedge and developed by passing it through a pair of nip rollers in contact with the aforementioned developer sheet to provide the step wedge image.

Having described the invention, it is to be understood that the invention is not limited to the specific embodiments disclosed, and that changes may be made therein without departing from the scope of the invention which is defined in the appended claims.

What is claimed is:

1. A photosensitive material comprising a support having on a surface thereof a plurality of capsules, said capsules containing, as the internal phase, a radiation sensitive composition which undergoes a change in viscosity upon exposure to actinic radiation, the sensitivity (log E) of said photosensitive material being less than 4.0 wherein upon exposing said material to actinic radiation and rupturing said capsules, said internal phase is image-wise released from said capsules and participates in forming a image.

2. The photosensitive material of claim 1 wherein said capsules are microcapsules having a discrete capsule wall.

3. The photosenstive material of claim 2 wherein said radiation sensitive composition comprises a photopolymerizable ethylenically unsaturated monomer, a photocrosslinkable polymer or a combination thereof.

4. The photosensitive material of claim 3 wherein said radiation sensitive material comprises a photoinitiator.

5. The photosensitive material of claim 4 wherein said radiation sensitive material is sensitive to ultraviolet, infrared, X-ray, electron beam, or visible radiation.

6. The photosensitive material of claim 5 wherein said internal phase carries, activates or mobilizes an image forming agent.

7. The photosensitive material of claim 6 wherein said image-forming agent is a color former or a color developer.

8. The photosensitive material of claim 7 wherein said image-forming agent is a substantially colorless electron donating color former.

9. The photosensitive material of claim 7 wherein said image-forming agent is an electron accepting color developer.

10. The photosensitive material of claim 8 wherein the sensitivity of said material is about 3 or less.

11. The photosensitive material of claim 10 wherein said material has associated therewith an electron accepting material which is capable of reacting with said colorless electron donating compound to form an image.

12. The photosensitive material of claim 11 wherein said electron accepting material is co-distributed on said support with said capsules in the same or a separate layer.

13. The photosensitive material of claim 11 wherein said electron accepting material is provided on a separate transfer sheet.

14. The photosensitive material of claim 13 wherein said colorless electron donating compound is present in said internal phase.

15. The photosensitive material of claim 4 wherein said image forming agent is a visible dye.

16. An image-forming process which comprises:
    image-wise exposing to actinic radiation a photosensitive material,
    said photosensitive material comprising a support having on a surface thereof a plurality of capsules distributed in a layer, said capsules containing, as the internal phase, a radiation sensitive composition which undergoes a change in viscosity upon exposure to actinic radiation, the sensitivity (log E) of said photosensitive material being less than 4.0,
    rupturing said capsules such that said capsules image-wise release said internal phase, and
    interacting said internal phase or an image-forming agent carried, activated, or mobilized by said internal phase with a developing agent to produce an image.

17. The image-forming process of claim 16 wherein said capsules are microcapsules having a discrete capsule wall.

18. The image-forming process of claim 17 wherein said radiation sensitive composition comprises a photopolymerizable ethylenically unsaturated monomer or a photocrosslinkable polymer or a combination thereof.

19. The image-forming process of claim 18 wherein said radiation sensitive composition comprises a photoinitiator.

20. The image-forming process of claim 19 wherein said internal phase contains an image-forming agent which reacts with said developing agent to form an image.

21. The image-forming process of claim 20 wherein said image-forming agent is an electron donating color former and said developing agent is an electron accepting color developer which reacts with said color former to produce an image.

22. The image-forming process of claim 21 wherein said developing agent is a toner having an affinity for said internal phase such that upon rupturing said capsules and contacting said photosensitive material with said toner, said toner selectively adheres to said material in the area of said ruptured capsules.

23. The image-forming process of claim 18 wherein said developing agent is a metal salt and said internal phase carries or mobilizes compound which reacts with said metal salt to form an image.

24. The image-forming process of claim 21 wherein said image-wise rupturing comprises rupturing said capsules in the exposed areas.

25. An image-forming process which comprises:
image-wise exposing to actinic radiation a photosensitive material,
said photosensitive material comprising a support having on a surface thereof a plurality of capsules distributed in a layer, said capsules containing, as the internal phase, a radiation sensitive composition which undergoes a change in viscosity upon exposure to actinic radiation and, the sensitivity of said photosensitive material being less than 4.0
rupturing said capsules such that said capsules image-wise release said internal phase and said internal phase image-wise carries, activates or mobilizes an image-forming agent, and
image-wise transferring said image-forming agent capsules to a receiving sheet to form an image thereon.

26. The image-forming process of claim 25 wherein said image-forming agent is a visible dye or pigment.

27. The image-forming process of claim 26 wherein said dye or pigment is present in said internal phase.

28. A transfer imaging system in which images are formed by image-wise reaction of one or more chromogenic materials and a developer, said system comprising:
an imaging sheet comprising a first substrate, a chromogenic material, a radiation curable composition which undergoes an increase in viscosity upon exposure to actinic radiation, a coating on one surface of said substrate comprising said chromogenic material and said radiation curable composition, said radiation curable composition being encapsulated in rupturable capsules as an internal phase, said imaging sheet having a sensitivity (log E) less than 4.0, and
a developer sheet comprising a second substrate and a developer material capable of reaction with said chromogenic material to form an image on one surface of said second substrate wherein images are formed by image-wise exposing said imaging sheet to actinic radiation, rupturing said capsules in the image areas such that said capsules image-wise release said internal phase and there is an image-wise transfer of said chromogenic material to said developer sheet and a patterned image-forming reaction occurs between said chromogenic material and said developer material.

29. A transfer imaging system in which images are formed by image-wise reaction of one or more chromogenic materials and a developer, said system comprising:
an imaging sheet comprising a first substrate, a chromogenic material, a radiation depolymerizable composition which undergoes a decrease in viscosity upon exposure to actinic radiation, a coating on one surface of said first substrate comprising said chromogenic material and said radiation depolymerizable composition, said radiation depolymerizable composition being encapsulated in rupturable capsules as an internal phase, said imaging sheet having a sensitivity (log E) less than 4.0, and
a developer sheet comprising a second substrate and a developer material capable of reacting with said chromogenic material to form an image on one surface of said second substrate, wherein images are formed by image-wise exposing said coating to actinic radiation, and rupturing capsules in the image areas with said coating in facial contact with said developer sheet such that said internal phase is image-wise released from said capsues and there is image-wise transfer of said chromogenic material to said developer sheet and a patterned image-forming reactiong occurs between said chromogenic material and said developer material.

* * * * *